United States Patent
Refai-Ahmed et al.

(10) Patent No.: US 9,668,334 B2
(45) Date of Patent: May 30, 2017

(54) THERMAL CLAMP APPARATUS FOR ELECTRONIC SYSTEMS

(71) Applicant: General Electric Company, Schenectady, NY (US)

(72) Inventors: Gamal Refai-Ahmed, Albany, NY (US); Hendrik Pieter Jacobus de Bock, Clifton Park, NY (US); Yogen Vishwas Utturkar, Niskayuna, NY (US); Christian M. Giovanniello, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 171 days.

(21) Appl. No.: 14/285,720

(22) Filed: May 23, 2014

(65) Prior Publication Data
US 2015/0342023 A1 Nov. 26, 2015

(51) Int. Cl.
*H05K 7/20* (2006.01)
*H05K 1/02* (2006.01)
*G06F 1/20* (2006.01)

(52) U.S. Cl.
CPC .......... *H05K 1/0203* (2013.01); *G06F 1/203* (2013.01); *H05K 7/2039* (2013.01); *H05K 7/20154* (2013.01); *H05K 7/20163* (2013.01); *H05K 7/20336* (2013.01); *Y10T 29/49126* (2015.01)

(58) Field of Classification Search
CPC .......... H05K 7/20254; H05K 7/20263; H05K 7/2039; H05K 7/20409; H05K 7/20509; H05K 7/20672

USPC ...... 361/676–678, 679.46–679.54, 688–723, 361/831; 174/252, 520, 526; 29/830, 29/832; 165/80.4, 104.21
See application file for complete search history.

(56) References Cited

U.S. PATENT DOCUMENTS

| | | | |
|---|---|---|---|
| 7,019,974 B2 * | 3/2006 | Lee ........................... | G06F 1/20 165/104.21 |
| 8,072,763 B2 * | 12/2011 | Li ......................... | H01L 23/4006 165/185 |
| 2005/0088822 A1 * | 4/2005 | Oberlin .................. | H01L 23/427 361/700 |
| 2007/0217162 A1 * | 9/2007 | Zhou .................... | H01L 23/4006 361/710 |

(Continued)

*Primary Examiner* — Courtney Smith
*Assistant Examiner* — Zhengfu Feng
(74) *Attorney, Agent, or Firm* — Ziolkowski Patent Solutions Group, SC; Jean K. Testa

(57) ABSTRACT

An electronic device includes an outer case defining an internal volume, a circuit board positioned within the internal volume and having a first surface and a second surface, one or more active components mounted on the first surface of the circuit board, and a thermal management system to provide cooling for the active components. The thermal management system includes a first heat spreader in thermal contact with an active component, a second heat spreader in thermal contact with the second surface of the circuit board, thermal carriers coupled to the first and second heat spreaders to remove thermal energy therefrom, and a heat exchanger coupled to the thermal carriers to receive thermal energy therefrom and dissipate the thermal energy, wherein one thermal carrier is routed between the first heat spreader and the heat exchanger and the other thermal carrier is routed between the second heat spreader and the heat exchanger.

20 Claims, 3 Drawing Sheets

(56) References Cited

U.S. PATENT DOCUMENTS

| | | | |
|---|---|---|---|
| 2008/0037227 A1* | 2/2008 | Fujiwara | G06F 1/203 361/722 |
| 2009/0052131 A1* | 2/2009 | Fujiwara | G06F 1/203 361/695 |
| 2009/0129020 A1* | 5/2009 | Fujiwara | G06F 1/203 361/697 |
| 2013/0141866 A1* | 6/2013 | Refai-Ahmed | H01L 23/3672 361/679.54 |

* cited by examiner

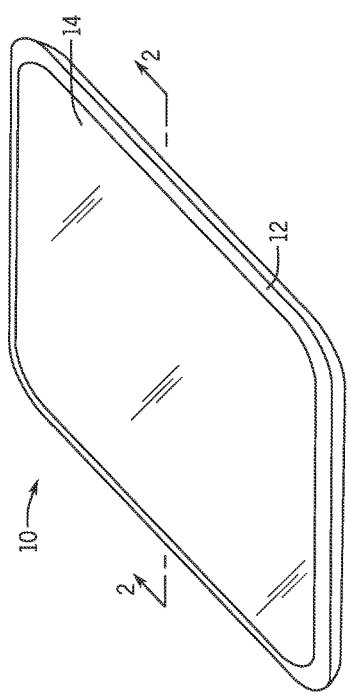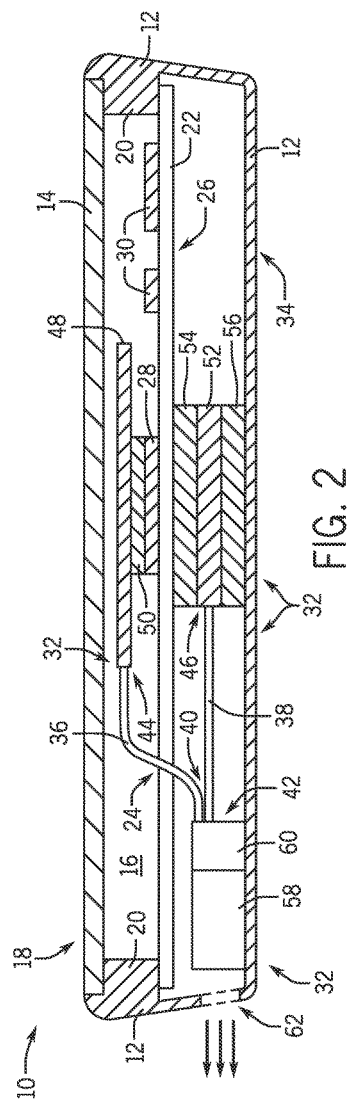

THERMAL CLAMP APPARATUS FOR ELECTRONIC SYSTEMS

BACKGROUND OF THE INVENTION

Embodiments of the invention relate generally to electronic devices and, more particularly, to a system for providing thermal management of electronic devices in a balanced fashion and via multiple thermal pathways.

Small form electronic devices, such as handheld computing devices (e.g., smart phones, tablet computers e-book readers, etc.) and embedded computing systems, present significant thermal management challenges. There is ongoing user demand for devices that are not only smaller form factor for greater portability but also powerful enough to handle video and other computing intensive tasks. The provision for significant computing power in a relatively small form device often translates into the need for significant thermal management of the heat dissipating devices.

One common solution used to transfer heat from a processor in a small form device includes the use of a heat spreader that is in thermal contact with the processor or active device/component. The heat spreader is in turn, in thermal contact with a heat exchanger via a heat pipe or other structure—with the heat exchanger often including an air mover, such as a fan, that vents air to the external ambient by way of a small vent.

It is recognized, however, that conventional thermal management systems such as the one described above have known limitations and drawbacks associated therewith. As one example, it is recognized that in such conventional thermal management systems only one mechanism is in place to remove the heat—that being the heat pipe and heat exchanger connected to a surface of the processor/active device. Therefore, if the heat pipe or a component of the heat exchanger were to fail (e.g., the fan in the heat exchanger plugging with dust), a potential thermal runaway could occur that causes overheating and/or damage to the device to occur.

As another example, even during normal operation of a conventional thermal management system, it is recognized that a portion of the heat generated by the processor or active component is not transferred to the heat pipe, but travels through a back surface of the processor (i.e., surface not connected to the heat pipe) to the printed circuit board (PCB) on which the processor is mounted. Accordingly, this portion of the heat that goes from the processor to the PCB has a poor thermal management, and this heat can have a thermal impact on neighboring devices, as well as create localized hot spots on the PCB. Given the fact that, in many applications, the PCB is in a close proximity to the case/skin of the computing device, heat transferred to the PCB can therefore also lead to hot spots on the case/skin, with which a user may come in contact with.

Still another potential pitfall associated with the conventional thermal management system just described is the issue of both acoustic and electrical noise associated with a cooling fan. Such issues can be reduced though not completely eliminated through the use of appropriate noise filtering circuitry and fan and vent design. However, there remains the issue of power consumption to run the fan.

Therefore, it would be desirable to provide a thermal management system for small form electronic devices that overcomes the aforementioned drawbacks, with such a system providing multiple thermal pathways, greater reliability, and reduced power consumption and acoustic noise generation.

BRIEF DESCRIPTION OF THE INVENTION

In accordance with one aspect of the invention, an electronic device includes an outer case generally defining an internal volume, a circuit board positioned within the internal volume and having a first surface and a second surface, one or more active components mounted on the first surface of the circuit board, and a thermal management system configured to provide cooling for the one or more active components. The thermal management system further includes a first heat spreader in thermal contact with at least one active component of the one or more active components, a second heat spreader in thermal contact with the second surface of the circuit board, a thermal carrier coupled to each of the first heat spreader and the second heat spreader to remove thermal energy therefrom, and a heat exchanger coupled to the thermal carriers to receive thermal energy therefrom and dissipate the thermal energy, wherein one thermal carrier is routed between the first heat spreader and the heat exchanger and the other thermal carrier is routed between the second heat spreader and the heat exchanger.

In accordance with another aspect of the invention, an electronic device includes an outer case generally defining an internal volume, a circuit board positioned within the internal volume and having a first surface and a second surface, one or more active components mounted on the first surface of the circuit board, and a thermal management system configured to provide cooling for the one or more active components. The thermal management system further includes a first heat spreader in thermal contact with at least one active component of the one or more active components and a second heat spreader in thermal contact with the second surface of the circuit board, wherein the second heat spreader is also in thermal contact with the outer case, such that thermal energy is transferred to the case and spread thereacross, so as to dissipate the thermal energy.

In accordance with yet another aspect of the invention, a method for removing heat from an electronic device includes thermally coupling a first heat spreader with at least one heat generating active component mounted on a first surface of a circuit board and thermally coupling a second heat spreader with a second surface of the circuit board that is opposite the first surface of the circuit board, such that the first heat spreader and the second heat spreader form a thermal clamp about the at least one heat generating active component and the circuit board, so as to provide double-sided heat removal therefrom. The method also includes thermally coupling the second heat spreader with an outer case of the electronic device, coupling a thermal carrier to each of the first heat spreader and the second heat spreader to remove heat therefrom that is generated by the at least one active component, and coupling the first and second thermal carriers to a single heat exchanger such that the heat exchanger receives heat from the thermal carriers and dissipates the heat.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings:

FIG. 1 is a pictorial view of a small form electronic device in which embodiments of the invention may be incorporated.

FIG. 2 is a sectional view of FIG. 1 taken at section 2-2, illustrating a thermal management system of the electronic device, according to an embodiment of the invention.

DETAILED DESCRIPTION

Embodiments of the invention relate generally to cooling electronics systems and, more particularly, to a thermal management system that utilizes multiple thermal paths to provide cooling to active components and other devices in such electronics systems.

Various types of small form electronics systems or devices may benefit from incorporation of embodiments of the invention, including handheld computing devices such as smart phones, tablet computers and e-book readers, as discussed herein. However, it is recognized that embodiments of the invention are not limited only to use with such handheld computing devices and that embodiments of the invention may be employed in other electronics system, such as embedded computing systems. Accordingly, the scope of the invention is not meant to be limited by the specific embodiments set forth here below.

Referring to FIG. 1, a pictorial view of an exemplary embodiment of a small form electronic device 10 is shown with which embodiments of the invention may be employed. The electronic device 10 may be any of a number of different types of devices, such as hand held computers, smart phones, tablets, e-book readers, or virtually any other portable computing device. In this illustrative embodiment, the electronic device 10 includes a case 12 and a screen or display 14 connected to the case 12. As shown, the case 12 and the screen 14 have a generally rectangular shape with rounded corners; however, the skilled artisan will appreciate that the footprints of the case 12 and the display 14 may take on virtually limitless numbers of configurations. The case 12 may be constructed of well-known plastics, metals, such as aluminum, stainless steel or the like, or combinations of such materials. The display 14 may be a liquid crystal display, a LED readout or virtually any other type of display device.

Figure 3:
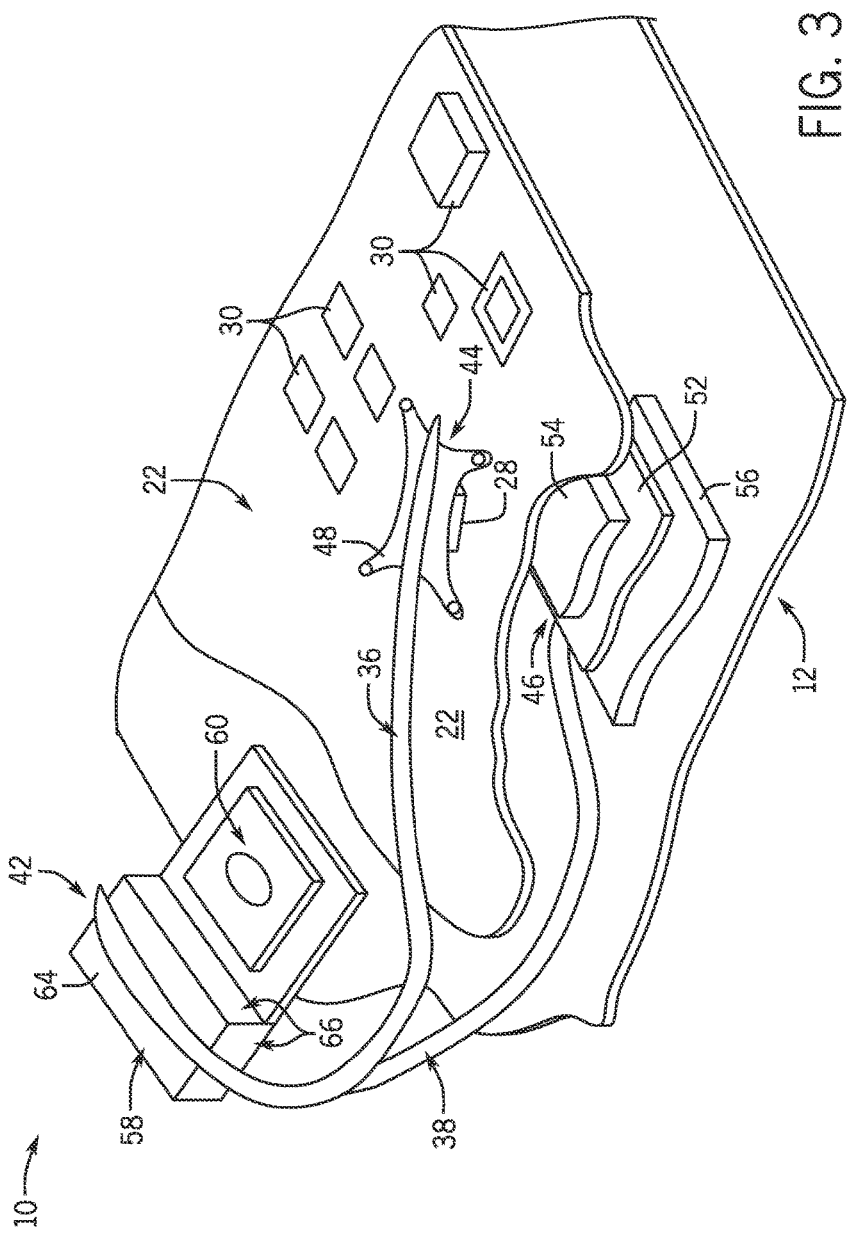
FIG. 3 is pictorial view of FIG. 1 with portions thereof removed, illustrating a thermal management system of the electronic device, according to an embodiment of the invention.

Additional details of the electronic device 10 may be understood by referring to FIGS. 2 and 3, which provide a sectional view of the electronic device at section 2-2 of FIG. 1 and a view of the electronic device with a portion of the case 12 removed therefrom, respectively. As shown in FIGS. 2 and 3, the case 12 generally defines an internal space or volume 16 for holding various components of the electronic device therein. The case 12 may include a front opening 18 to accommodate the display 14 and a peripheral shelf 20 that circumscribes the opening 18 and provides a seating area for the display 14.

A circuit board 22 is positioned in the internal volume 16 and may be secured to an underside of the peripheral shelf 20 by way of one or more screws (not shown) or other fasteners. The circuit board 22 may be a system board, a daughter board or other type of printed circuit board and composed of a variety of materials, such as well-known ceramics, organic materials such as one or more epoxy layers or other materials. The circuit board 22 includes plural surface and/or internal conductor traces (not visible) interconnected by vias as desired—with the circuit board having a front surface 24 and back surface 26. Depending on the complexity of the electronic device 10, the circuit board 22 may be populated by numerous components.

A few exemplary components are shown in FIGS. 2 and 3 as being surface-mounted to the circuit board 22 on front surface 24 thereof, with such components including at least one active component 28, as well as additional components 30 that may be active or passive devices. The active component(s) may be any of a large number of different types of circuit devices used in electronics, such as, for example, microprocessors, graphics processors, combined microprocessor/graphics processors, application specific integrated circuits, memory devices or the like, and may be single or multi-core or even stacked with or accompanied by additional dice. The active component(s) may be constructed of bulk semiconductor, such as silicon or germanium, or semiconductor-on-insulator materials, such as silicon-on-insulator materials. The active component(s) may be packaged within a known packaging structure and may be connected to the circuit board 22 by a ball grid array, a land grid array, a compression fit or virtually any other type of interconnect structure. The passive components may be provided as resistors, capacitors, etc.

A thermal management system 32 is also included in the device 10 that is designed to keep the temperature of the active (and passive) components 28, 30 and the exterior surface of the case 12 (i.e., skin 34) within acceptable/comfortable limits. The thermal management system 32 functions to provide a balanced thermal management to the electronic device 10 by providing a plurality of thermal pathways to remove heat from the active component 28, as well as from the other components 3 and from the circuit board 22.

As shown in FIGS. 2 and 3, the thermal management system 32 includes a number of thermal carriers 36, 38 that are provided to remove heat from the active component 28 as well as from the other components 30 and from the circuit board 22. The thermal carriers 36, 38 can generally be characterized as a "main" thermal carrier 36 and a "secondary" thermal carrier 38. Each of the main thermal carrier 36 and the secondary thermal carrier 38 are coupled at one end 40 to a common heat exchanger 42, while the other ends 44, 46 of the respective thermal carriers 36, 38 are decoupled from each other. The end 44 of the main thermal carrier 36 is in thermal contact/communication with the active component 28, while the end 46 of the secondary thermal carrier 38 is in thermal contact/communication with the circuit board 22 on a back surface 26 thereof (i.e., surface opposite the active component 28).

According to an exemplary embodiment of the invention, the main and secondary thermal carriers 36, 38 are in the form of heat pipes. At the hot interface of each heat pipe 36, 38—where the heat pipe is in thermal contact with the active component 28 or the circuit board 22—a liquid within the heat pipe 36, 38 that is in contact with a thermally conductive solid surface turns into a vapor by absorbing heat from that surface. The vapor then travels along the heat pipe 36, 38 to the cold interface—where the heat pipe 36, 38 is connected to the heat exchanger 42—and condenses back into a liquid, thereby releasing the latent heat. The liquid then returns to the hot interface through either capillary action, centrifugal force, or gravity, and the cycle repeats. Due to the very high heat transfer coefficients for boiling and condensation, heat pipes are highly efficient thermal conductors (e.g., effective thermal conductivity can approach 100,000 W/m K).

It is recognized, however, that the main and secondary thermal carriers 36, 38 may be provided in other forms and as other devices. That is, rather than being provided as heat pipes, the thermal carriers may take the form of vapor chamber (i.e., a metal container that has two phase flow movement), or a metal or high thermal conductive carrier.

As shown in FIGS. 2 and 3, the main thermal carrier 36 is coupled to or integrated with a heat spreader 48 (e.g., metal plate) at end 44, such as via solder bonding for example. The heat spreader 48 is placed in thermal contact with the active component 28 by way of a thermal interface material (TIM) 50, with the heat spreader 48 being secured to the TIM 50 either via the inherent tackiness of the TIM or via fasteners (not shown). The heat spreader 48 is advantageously fabricated as a sheet with a relatively large surface area compared to the size of the active component 28, and from a variety of thermally conducting materials, such as copper, aluminum, stainless steel, nickel, laminates of these or other like materials. The TIM 50 may be composed of a variety of interface materials, such as silicone-based greases or gels, phase change materials (PCMs) or others, and with or without thermally conducting fillers, such as silver or nanoparticles. Examples include Shin Tu Su G750, and Laird PCM 780SP, or indium, for example. It is recognized, however, that the TIM 50 is selected to have a less than perfectly optimal thermal conductivity, as the goal is to provide enough thermal resistance between the heat spreader 48 and the active component 28 so that the junction temperature of the active component 28 remains below damaging levels, yet high enough that heat is transferred from the active component 28 to the heat spreader 48 somewhat slowly. In this way, heat does not simply pass quickly and concentrate at a center portion of the heat spreader 48 that is proximate the active component 28, but instead spreads laterally across the extent of the heat spreader 48.

The end 46 of secondary thermal carrier 38 is coupled to or integrated with a separate heat spreader 52 (e.g., metal plate), such as via solder bonding for example, with the secondary thermal carrier 38 and heat spreader 52 being positioned adjacent the back surface 26 of the circuit board 22. The heat spreader 52 is placed in thermal contact with the circuit board 22 via an electrically insulating and relatively compliant thermal pad 54 positioned between the heat spreader 52 and the circuit board 22, with a surface of the heat spreader being secured to the thermal pad either via the inherent tackiness of the thermal pad 54 or via fasteners (not shown). The thermal pad 54 may be composed of relatively compliant heat transfer materials such as TFlex 740 or 340 from Laird or dispensable polymeric materials such as T570 or T630 from Chomerics. In this way, heat is transferred not only from the active component 28 but also from other heat generating components 30 that may be present on the surface 24 of the circuit board 22.

While heat is removed from the back side 26 of the circuit board 22 via the secondary thermal carrier 38 and heat spreader 52, heat is also removed from the back side of the circuit board 22 via the thermal coupling of the circuit board 22 to the case 12 of electronic device 10. As shown in FIGS. 2 and 3, the heat spreader 52 is thermally coupled with the case 12 via a thermal pad 56 positioned between the heat spreader 54 and the case 12, with the thermal pad 56 being positioned so as to be in contact with a surface of heat spreader 52 and an inner surface of case 12. The thermal pad 56 may be formed similar to thermal pad 54 on the other surface of heat spreader 52, and thus may be composed of relatively compliant heat transfer materials such as TFlex 740 or 340 from Laird or dispensable polymeric materials such as T570 or T630 from Chomerics. The thermal pad 56 acts to transfer heat from the heat spreader 52 (generated by the circuit board 22—i.e., the components 28, 30 thereon) to the case 12, with heat being transferred through the thermal pad 56 in a distributed fashion so as to be spread laterally across the case 12 of the electronic device 10.

In combination, the heat spreader 48 and heat spreader 52 form a "thermal clamp" about the circuit board 22 and the components 28, 30 thereon, to provide for double-sided heat removal therefrom. For dissipating the heat removed from the circuit board 22 and components 28, 30 by the thermal clamp 48, 52, multiple thermal pathways are provided from the heat spreaders 48, 52—including the thermal carriers 36, 38 connected between the heat spreaders 48 and 52 and the heat exchanger 42, and the thermal pad 56 connected between heat spreader 52 and the case 12.

Referring still to FIGS. 2 and 3, it is seen that each of the main the mal carrier 36 and the secondary thermal carrier 38 are coupled at end 40 to the heat exchanger 42 of the thermal management system 32. The heat exchanger 42 includes a heat sink 58 and air mover 60 that work in conjunction to dissipate heat from generated from the active component 28 (and components 30) of the electronic device 10, with the heat exchanger 42 being positioned within the case 12 adjacent a vent 62 of the case 12 (FIG. 2) so as to enable the heat exchanger 42 to vent air to the external ambient.

The heat sink 58 of heat exchanger 42 is of standard construction and thus may be constructed of aluminum, for example, or another metal having a relatively high thermal conductivity, such as a copper or a copper-aluminum combination. As depicted in FIG. 3, the heat sink 58 is generally formed to have a base 64 and a number of fins 66 (e.g., plates, pins) extending from the base 64 so as to define a plurality of channels. The main thermal carrier 36 and the secondary thermal carrier 38 are attached to the base 64, such that thermal energy is transferred from the carriers to the base 64, and the series of fins 66 protrude out from the base 64 to more effectively dissipate the thermal energy absorbed by the heat sink 58. The air mover 60 generates an air flow that is passed through the channels formed by fins 66 to dissipate the heat/thermal energy in the fins.

Figure 4:
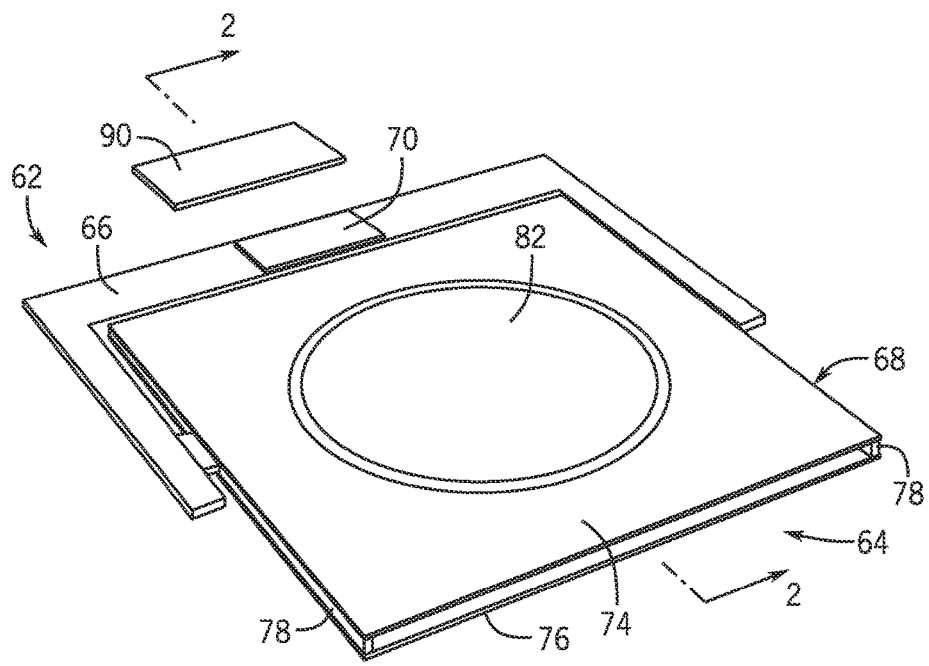
FIGS. 4 and 5 are views of a synthetic jet assembly useable with embodiments of the invention.
Figure 5:
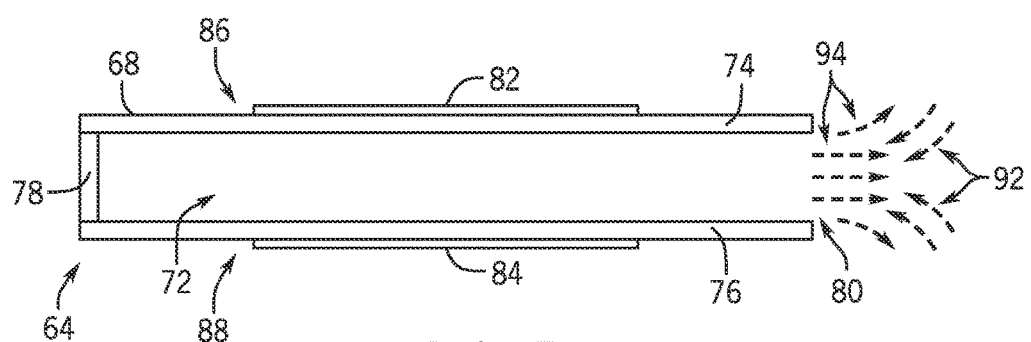

According to embodiments of the invention, the air mover 60 of heat exchanger 58 may take one of several forms. As one example, the air mover 60 may be a fan of standard type that is powered to direct an air flow across heat sink 58. As another example, and in a preferred embodiment, the air mover 60 is formed of one or more synthetic jet actuators that are powered to direct an air flow across heat sink 58. The general structure of a synthetic jet (and mechanism for mounting the synthetic jet) that could be utilized as the air mover 60 of heat exchanger 58 is shown and described in FIGS. 4 and 5 for purposes of better understanding such an embodiment. While a specific synthetic jet assembly is illustrated in FIGS. 4-5, it is recognized that synthetic jet assemblies of varied constructions may be used as the air mover 60 of the heat exchanger 42—including an arrangement of synthetic jets in a synthetic jet stack or jet pack— and thus the synthetic jet assembly is not meant to limit the scope of the invention. As an example, synthetic jet assemblies that do not include a mounting bracket for securing/positioning a synthetic jet are considered to be within the scope of the invention.

Referring first to FIG. 4, the synthetic jet assembly 62 is shown as including a synthetic jet 64, a cross-section of which is illustrated in FIG. 5, and a mounting bracket 66. In one embodiment, mounting bracket 66 is a u-shaped mounting bracket that is affixed to a body or housing 68 of synthetic jet 64 at one or more locations. A circuit driver 70 can be externally located or affixed to mounting bracket 66. Alternatively, circuit driver 70 may be remotely located from synthetic jet assembly 62.

Referring now to FIGS. 4 and 5 together, and as shown therein, housing 68 of synthetic jet 64 defines and partially encloses an internal chamber or cavity 72 having a gas or fluid 22 therein. While housing 68 and internal chamber 72 can take virtually any geometric configuration according to various embodiments of the invention, for purposes of discussion and understanding, housing 68 is shown in cross-section in FIG. 2 as including a first plate 74 and a second plate 76 (alternately referred to as blades or foils), which are maintained in a spaced apart relationship by a spacer element 78 positioned therebetween. In one embodiment, spacer element 78 maintains a separation of approximately 1 mm between first and second plates 74, 76. One or more orifices 80 are formed between first and second plates 74, 76 and the side walls of spacer element 78 in order to place the internal chamber 72 in fluid communication with a surrounding, exterior environment. In an alternative embodiment, spacer element 78 includes a front surface (not shown) in which one or more orifices 80 are formed.

Actuators 82, 84 are coupled to respective first and second plates, 74, 76 to form first and second composite structures or flexible diaphragms 86, 88, which are controlled by driver 70 via a controller assembly or control unit system 90. For example, each flexible diaphragm 86, 88 may be equipped with a metal layer and a metal electrode may be disposed adjacent to the metal layer so that diaphragms 86, 88 may be moved via an electrical bias imposed between the electrode and the metal layer. As shown in FIG. 4, in one embodiment controller assembly 90 is electronically coupled to driver 70, which is coupled directly to mounting bracket 66 of synthetic jet 64. In an alternative embodiment control unit system 90 is integrated into a driver 70 that is remotely located from synthetic jet 64. Moreover, control system 90 may be configured to generate the electrical bias by any suitable device, such as, for example, a computer, logic processor, or signal generator.

In one embodiment, actuators 82, 84 are piezoelectric motive (piezomotive) devices that may be actuated by application of a harmonic alternating voltage that causes the piezomotive devices to rapidly expand and contract. During operation, control system 90 transmits an electric charge, via driver 70, to piezoelectric actuators 82, 84, which undergo mechanical stress and/or strain responsive to the charge. The stress/strain of piezomotive actuators 82, 84 causes deflection of respective first and second plates 74, 76 such that a time-harmonic or periodic motion is achieved that changes the volume of the internal chamber 72 between plates 74, 76. The resulting volume change in internal chamber 72 causes an interchange of gas or other fluid between internal chamber 72 and the exterior volume, with a gas being drawn into the internal chamber 72 through orifice 80 when first and second plates 74, 76 move outward and the volume of the internal chamber 72 is increased—generally indicated in phantom by 92—and with a gas being ejected from the internal chamber 72 through orifice 80 as a cooling jet when first and second plates 74, 76 move inward and the volume of the internal chamber 72 is decreased—generally indicated in phantom by 94.

Beneficially, embodiments of the invention thus provide a thermal management system 32 for a small form electronic device, such as a smart phone, tablet computer, e-book reader, or embedded computing system, for example. The thermal management system 32 provides a balanced thermal management of the electronic device from different directions via the use of multiple thermal carriers 36, 38 and heat spreaders 48, 52. The thermal carriers 36, 38 conduct heat from various surfaces of a circuit board 22, and components 28, 30 thereon, away to a heat exchanger 42 for dissipation to the ambient environment. Additionally, a thermal path is provided from the circuit board 22 to the case 12 of the electronic device—with heat from the circuit board 22 being spread across the case 12 in such a fashion as to reduce the hot localized skin temperature of the device.

The multiple and balanced thermal pathways in thermal management system 32 provide for dissipation of heat generated by the components 28, 30, even in the event that a thermal carrier 36, 38 or the heat exchanger 42 (e.g., air mover 60 in the heat exchanger) fails, thereby preventing a potential thermal runaway that might occur in a typical cooling system were the thermal carrier or the heat exchanger to fail. The multiple and balanced thermal pathways in thermal management system 32 also allow for the air mover 60 of the heat exchanger to operate at a reduced load and/or for the air mover 60 to operate less frequently. This reduced operation of the air mover 60 can reduce the lower acoustic noise and mechanical vibration in the heat exchanger 42.

Therefore, according to one embodiment, an electronic device includes an outer case generally defining an internal volume, a circuit board positioned within the internal volume and having a first surface and a second surface, one or more active components mounted on the first surface of the circuit board, and a thermal management system configured to provide cooling for the one or more active components. The thermal management system further includes a first heat spreader in thermal contact with at least one active component of the one or more active components, a second heat spreader in thermal contact with the second surface of the circuit board, a thermal carrier coupled to each of the first heat spreader and the second heat spreader to remove thermal energy therefrom, and a heat exchanger coupled to the thermal carriers to receive thermal energy therefrom and dissipate the thermal energy, wherein one thermal carrier is routed between the first heat spreader and the heat exchanger and the other thermal carrier is routed between the second heat spreader and the heat exchanger.

According to another embodiment, an electronic device includes an outer case generally defining an internal volume, a circuit board positioned within the internal volume and having a first surface and a second surface, one or more active components mounted on the first surface of the circuit board, and a thermal management system configured to provide cooling for the one or more active components. The thermal management system further includes a first heat spreader in thermal contact with at least one active component of the one or more active components and a second heat spreader in thermal contact with the second surface of the circuit board, wherein the second heat spreader is also in thermal contact with the outer case, such that thermal energy is transferred to the case and spread thereacross, so as to dissipate the thermal energy.

According to yet another embodiment, a method for removing heat from an electronic device includes thermally coupling a first heat spreader with at least one heat generating active component mounted on a first surface of a circuit board and thermally coupling a second heat spreader with a second surface of the circuit board that is opposite the first surface of the circuit board, such that the first heat spreader and the second heat spreader form a thermal clamp about the at least one heat generating active component and the circuit board, so as to provide double-sided heat removal therefrom. The method also includes thermally coupling the second heat spreader with an outer case of the electronic device, coupling a thermal carrier to each of the first heat spreader and the second heat spreader to remove heat therefrom that is generated by the at least one active component, and coupling the first and second thermal carriers to a single heat exchanger such that the heat exchanger receives heat from the thermal carriers and dissipates the heat.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electronic device comprising:
   an outer case generally defining an internal volume;
   a circuit board positioned within the internal volume and having a first surface and a second surface;
   one or more active components mounted on the first surface of the circuit board; and
   a thermal management system that cools the one or more active components, the thermal management system comprising:
      a first heat spreader in thermal contact with at least one active component of the one or more active components;
      a second heat spreader in thermal contact with the second surface of the circuit board;
      a heat transfer material directly and mechanically coupled to the second heat spreader and to the second surface of the circuit board so as to be positioned between the second heat spreader and the second surface of the circuit board;
      thermal carriers coupled to the first and second heat spreaders to remove thermal energy therefrom; and
      a heat exchanger coupled to the thermal carriers to receive thermal energy therefrom and dissipate the thermal energy;
      wherein one of the thermal carriers is routed between the first heat spreader and the heat exchanger and another thermal carrier of the thermal carriers is routed between the second heat spreader and the heat exchanger.

2. The electronic device of claim 1 wherein the thermal carriers coupled to the first and second heat spreaders comprise heat pipes.

3. The electronic device of claim 1 further comprising a thermal interface material positioned between the first heat spreader and the at least one active component to transfer thermal energy from the at least one active component to the first heat spreader.

4. The electronic device of claim 1 wherein the heat transfer material comprises a first thermal pad positioned between the second heat spreader and the circuit board to transfer thermal energy from the circuit board to the second heat spreader.

5. The electronic device of claim 1 wherein the second heat spreader is in thermal contact with the outer case, such that thermal energy is transferred to the case and spread thereacross, so as to dissipate the thermal energy.

6. The electronic device of claim 5 further comprising a second thermal pad positioned between the second heat spreader and the outer case to transfer thermal energy from the second heat spreader to the case.

7. The electronic device of claim 5 wherein the dissipation of thermal energy through the heat exchanger and the dissipation of thermal energy through the case provides a balanced thermal management of the electronic device.

8. The electronic device of claim 1 wherein the heat exchanger comprises:
   a heat sink that receives thermal energy from the thermal carriers; and
   an air mover that generates an air flow, the air mover being positioned to direct the air flow across the heat sink to dissipate the thermal energy received from the thermal carriers.

9. The electronic device of claim 8 wherein the case includes a vent formed therein, and where the air flow generated by the air mover that is blown across the heat sink and exits the case out through the vent so as to dissipate the thermal energy to an external ambient environment.

10. The electronic device of claim 8 wherein the air mover comprises one or more synthetic jet actuators.

11. An electronic device comprising:
   an outer case generally defining an internal volume;
   a circuit board positioned within the internal volume and having a first surface and a second surface;
   one or more active components mounted on the first surface of the circuit board; and
   a thermal management system that cools the one or more active components, the thermal management system comprising:
      a first heat spreader in thermal contact with at least one active component of the one or more active components;
      a second heat spreader in thermal contact with the second surface of the circuit board; and
      a first thermal pad positioned between the second heat spreader and the circuit board so as to be in direct contact with each of the second heat spreader and the circuit board, such that the first thermal pad is positioned to transfer thermal energy from the circuit board to the second heat spreader;
      wherein the second heat spreader is also in thermal contact with the outer case, such that thermal energy is transferred to the case and spread thereacross, so as to dissipate the thermal energy.

12. The electronic device of claim 11 further comprising a second thermal pad positioned between the second heat spreader and the outer case to transfer thermal energy from the second heat spreader to the outer case.

13. The electronic device of claim 11 wherein the thermal management system further comprises:
   a main thermal carrier coupled to the first heat spreader to remove thermal energy therefrom;
   a secondary thermal carrier coupled to the second heat spreader to remove thermal energy therefrom; and
   a heat exchanger coupled to the main and secondary thermal carriers to receive thermal energy therefrom and dissipate the thermal energy;
   wherein the main thermal carrier is routed between the first heat spreader and the heat exchanger and the secondary thermal carrier is routed between the second heat spreader and the heat exchanger.

14. The electronic device of claim 13 further comprising a thermal interface material positioned between the first heat spreader and the at least one active component to transfer thermal energy from the at least one active component to the first heat spreader.

15. The electronic device of claim 13 wherein the dissipation of thermal energy through the heat exchanger and the dissipation of thermal energy through the case provides a balanced thermal management of the electronic device.

16. The electronic device of claim 13 wherein the heat exchanger comprises:
 a heat sink including a base and a plurality of fins; and
 an air mover that generates an air flow, the air mover being positioned to direct the air flow across the plurality of fins to dissipate thermal energy received;
 wherein the main thermal carrier and the secondary thermal carrier are coupled to the base of the heat sink to transfer thermal energy to the heat sink.

17. The electronic device of claim 13 wherein each of the main thermal carrier and the secondary thermal carrier comprise a heat pipe.

18. A method for removing heat from an electronic device comprising:
 thermally coupling a first heat spreader with at least one heat generating active component mounted on a circuit board, the at least one active component mounted on a first surface of the circuit board;
 thermally coupling a second heat spreader with a second surface of the circuit board that is opposite the first surface of the circuit board by positioning a first thermal pad to directly contact the second heat spreader and the second surface of the circuit board;
 thermally coupling the second heat spreader with an outer case of the electronic device;
 coupling thermal carriers to the first and second heat spreaders to remove heat therefrom, the heat being generated by the at least one active component; and
 coupling the thermal carriers to a single heat exchanger, the heat exchanger coupled to the thermal carriers to receive heat therefrom and dissipate the heat;
 wherein the first heat spreader and the second heat spreader form a thermal clamp about the at least one heat generating active component and the circuit board, so as to provide double-sided heat removal from the at least one heat generating active component and the circuit board.

19. The method of claim 18 wherein thermally coupling the second heat spreader to the second surface of the circuit board and to the outer case comprises:
 positioning a first thermal pad between the second heat spreader and the second surface of the circuit board to thermally couple the circuit board to the second heat spreader; and
 positioning a second thermal pad between the second heat spreader and the outer case to thermally couple the second heat spreader to the outer case.

20. The method of claim 18 further comprising dissipating heat generated by the at least one heat generating active component through the heat exchanger and through the outer case to provide a balanced thermal management of the electronic device.

* * * * *